United States Patent [19]

Lesk et al.

[11] Patent Number: 4,881,115

[45] Date of Patent: Nov. 14, 1989

[54] BIPOLAR SEMICONDUCTOR DEVICE HAVING A CONDUCTIVE RECOMBINATION LAYER

[75] Inventors: Israel A. Lesk; Lowell E. Clark, both of Phoenix, Ariz.

[73] Assignee: Motorola Inc., Schaumburg, Ill.

[21] Appl. No.: 312,268

[22] Filed: Feb. 21, 1989

Related U.S. Application Data

[62] Division of Ser. No. 138,262, Dec. 28, 1987, Pat. No. 4,837,177.

[51] Int. Cl.$^4$ .......................................... H01L 29/167
[52] U.S. Cl. .......................................... 357/64; 357/34; 357/59
[58] Field of Search ............................ 357/34, 64, 59

[56] References Cited

U.S. PATENT DOCUMENTS

| | | |
|---|---|---|
| 3,894,893 | 7/1975 | Kabaya .................................. 357/40 |
| 3,899,793 | 8/1975 | Wakamiya ............................. 357/64 |
| 4,259,683 | 3/1981 | Adler ..................................... 357/64 |

FOREIGN PATENT DOCUMENTS 60-51700  3/1985  Japan ..................................... 357/59

Primary Examiner—Andrew J. James
Assistant Examiner—David L. Sultz
Attorney, Agent, or Firm—Harry Wolin

[57] ABSTRACT

A semiconductor device having a conductive recombination layer. The conductive recombination layer, comprised of doped polycrystalline material, doped polycrystalline material and tungsten silicide, or tungsten silicide, is disposed between two separate semiconductor substrates which are bonded together using a polished surface on the conductive recombination layer as one of the bonding interfaces. The conductive recombination layer recombines minority carriers and thereby increases the switching speed of the device.

13 Claims, 3 Drawing Sheets

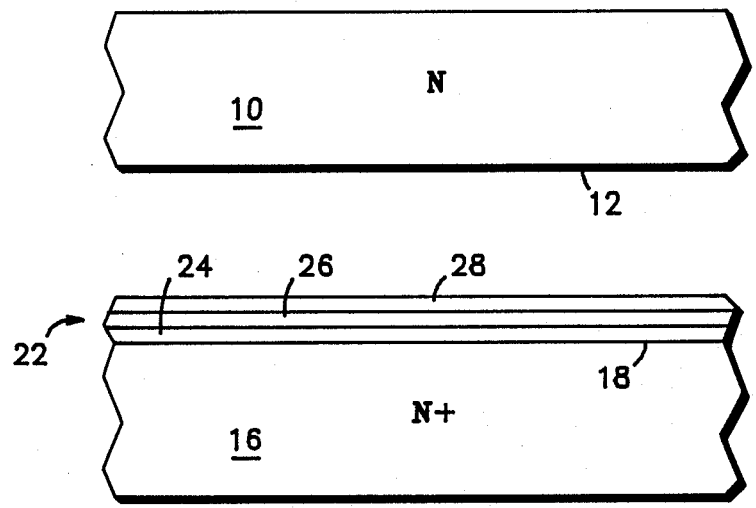
FIG. 3
FIG. 4
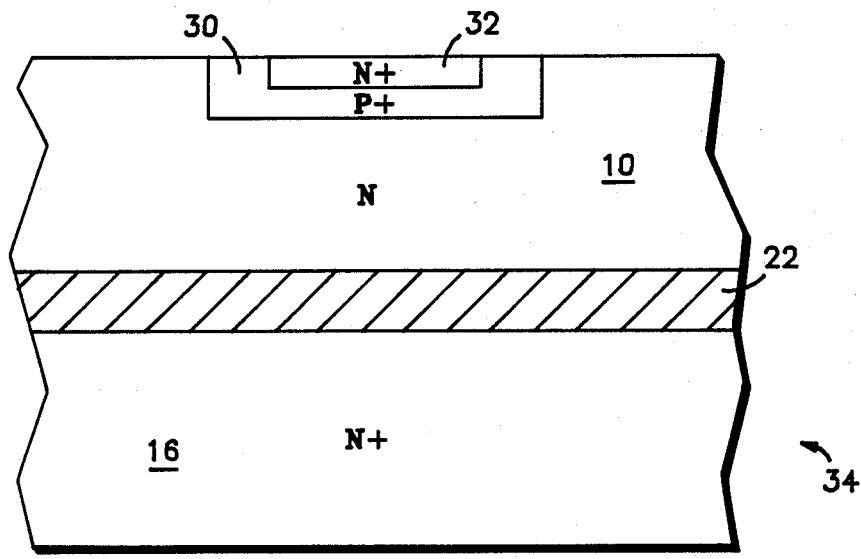

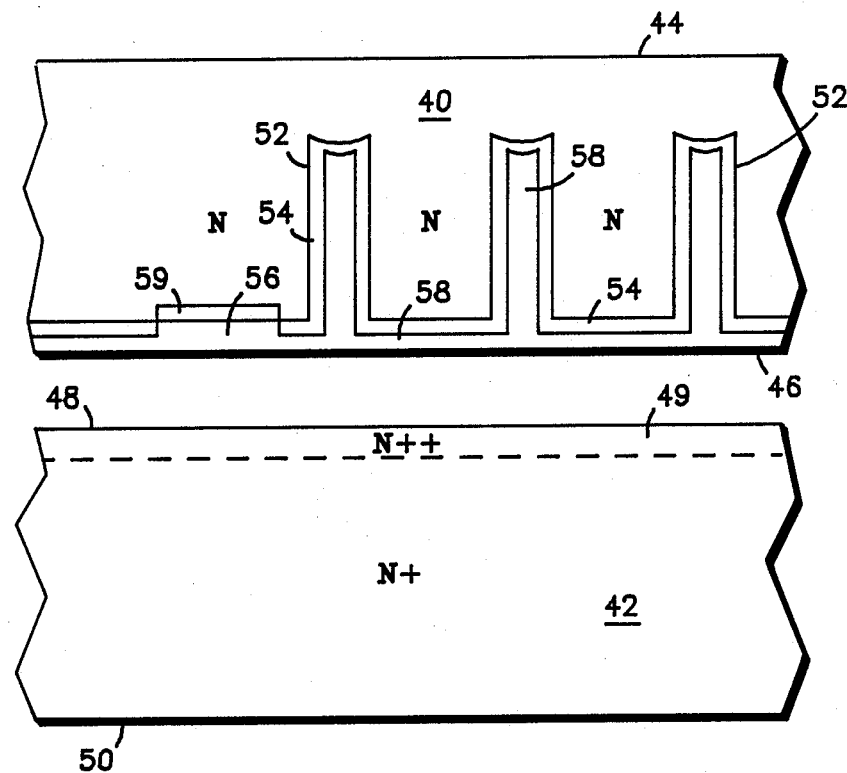
FIG. 5
FIG. 6
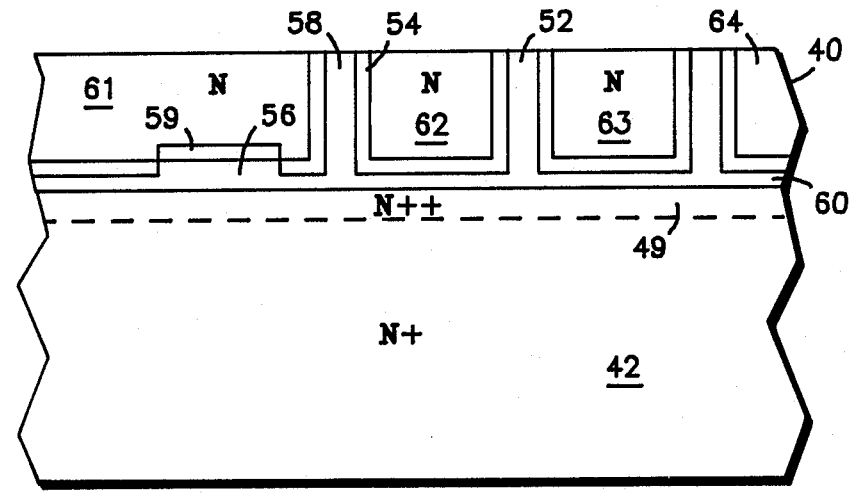

4,881,115

BIPOLAR SEMICONDUCTOR DEVICE HAVING A CONDUCTIVE RECOMBINATION LAYER

This is a division of application Ser. No. 07/138,262, filed Dec. 28, 1987 now, now U.S. Pat. No. 4,837,177.

BACKGROUND OF THE INVENTION

This invention generally pertains to a bipolar semiconductor device having a conductive recombination layer. Generally, in semiconductor devices of this type, it is desirable to have a relatively high switching speed while maintaining a reduce "on" state voltage. Commonly, there is a high level of minority carriers in the voltageblocking semiconductor region which must be removed before a semiconductor device of this type may be turned off. Removing the minority carriers takes a relatively long period of time and results in heating throughout the device. However, if no minority carriers are provided, the "on" state voltage will be extremely high due to a high resistance throughout the semiconductor region of the device. Therefore, a recombination layer which would reduce but not eliminate the minority carrier concentration in the voltage-blocking semiconductor region of a device would be highly desirable.

In the past, methods of doping semiconductor devices with impurities such as gold and nickel resulted in faster minority carrier recombination during the turn off of the device thereby increasing the switching speed. However, since these impurities were present throughout the device, a large voltage drop was caused. Therefore, a recombination layer disposed between layers of varying doping concentration has been found to be highly desirable.

SUMMARY OF THE INVENTION

The present invention pertains to a bipolar semiconductor device having a conductive recombination layer. It is known that in high voltage transistors, minority carriers move through the relatively lightly doped region of the collector quickly to reduce the voltage drop therein but do not readily combine in the more heavily doped substrate region of the semiconductor body. Therefore, switching speed may be increased by increasing minority carrier recombination in or near a highly doped region of a collector. The present invention accomplishes this by disposing a conductive recombination layer between lightly doped and highly doped regions of the collector. A process for fabricating a collector of this type includes providing a relatively lightly doped semiconductor substrate and a relatively highly doped semiconductor substrate. A conductive recombination layer is formed on a first surface of the highly doped semiconductor substrate. This conductive recombination layer may consist of heavily doped polysilicon, polysilicon doped with a slow moving element such as titanium, tungsten silicide or a combination of highly doped polysilicon and tungsten silicide. Once the conductive recombination layer has been formed, it is polished as is a first surface of the lightly doped semiconductor wafer and they are bonded together to form the collector region of a bipolar semiconductor device. Further the present invention may be incorporated into an integrated circuit.

Accordingly, it is an object of the present invention to provide a new and improved semiconductor device having a conductive recombination layer for providing increased switching speed.

It is a further object of the present invention to provide a new and improved semiconductor device having a conductive recombination layer which has a reduced voltage drop during switching.

It is a further object of the present invention to provide a new and improved semiconductor device having a conductive recombination layer wherein the high level of minority carriers in the collector is reduced in the vicinity of the relatively highly doped collector region.

It is a further object of the present invention to produce a new and improved semiconductor device having a conductive recombination layer which may easily be disposed between regions of a semiconductor device or integrated circuit.

These and other objects of this invention will become more apparent to those skilled in the art upon consideration of the accompanying specification, claims and drawings.

BRIEF DESCRIPTION OF THE DRAWINGS

Referring to the drawings, wherein like characters indicate like parts throughout the figures:

FIGS. 1–4 are highly enlarged cross sectional views of sections of the preferred embodiment of a bipolar semiconductor device having a conductive recombination layer during various stages of processing.

FIGS. 5–6 are highly enlarged cross-sectional views of sections of the preferred embodiment of an integrated circuit having a conductive recombination layer during various stages of processing.

DESCRIPTION OF THE PREFERRED EMBODIMENTS

Figure 1:
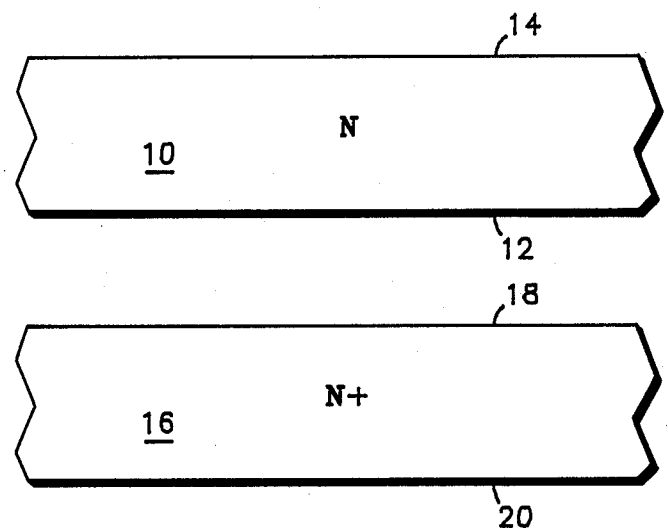
Figure 2:
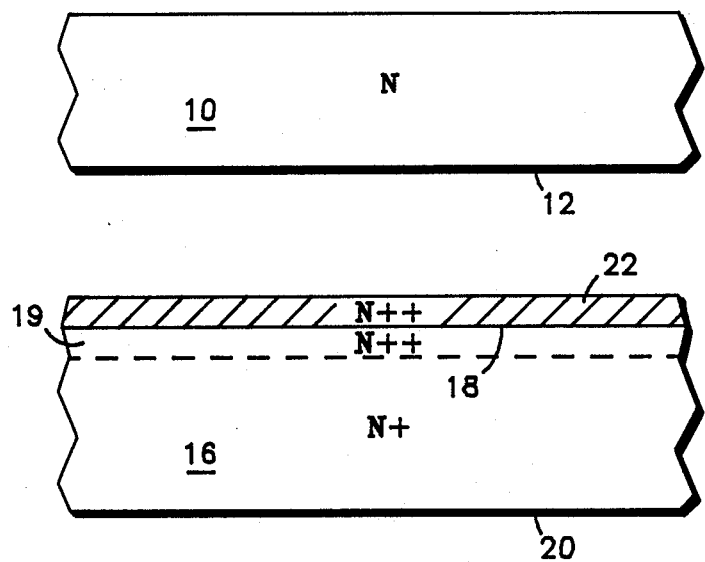

Referring specifically to FIGS. 1-2, highly enlarged cross-sectional views of sections of semiconductor substrates used in providing a conductive recombination layer are shown during various stages of processing. Initially, a first semiconductor substrate, 10, is provided. First semiconductor substrate 10 includes a first surface, 12, and a second surface, 14. Also provided is a second semiconductor substrate, 16, which includes a first surface, 18, and a second surface, 20. In this example, first semiconductor substrate 10 and second semiconductor substrate 16 are silicon semiconductor substrates. However, it should be understood that semiconductor substrates made of other material may also be used. Also in this example, first semiconductor substrate 10 is relatively lightly doped and has an N conductivity type while second semiconductor substrate 16 is relatively highly doped having an N+conductivity type. It will be understood by those skilled in the art that semiconductor substrates 10 and 16 may have varying dopant concentrations as well as different conductivity types.

It is desirable that first surface 18 and second surface 20 of second semiconductor substrate 16 be parallel. Additionally, it is also desirable that first surface 12 and second surface 14 of first semiconductor substrate 10 be parallel. This is so that semiconductor substrates 10 and 16 may be lapped and polished during or after the fabrication process of the semiconductor device to meet size requirements and remain parallel while doing so. Once first surface 18 and second surface 20 of second semiconductor substrate 16 have been made parallel, a conductive recombination layer 22, is formed on first surface 18 of second semiconductor substrate 16. It is understood that conventional semiconductor process techniques are utilized to form recombination layer 22 on substrate 16.

In one embodiment of the present invention, conductive recombination layer 22 comprises a doped polycrystalline material such as polysilicon. The polysilicon material conductive recombination layer 22 is deposited and then a phosphorous dopant is diffused to make the polysilicon highly conductive. In this example, conductive recombination layer 22 has an N++ conductivity type but those skilled in the art will understand that other conductivity types may be used. While the phosphorous dopant is being diffused throughout conductive recombination layer 22, a certain amount will diffuse into second semiconductor substrate 16 in the area of its first surface 18 thereby creating an N++ conductivity type layer, 19, in substrate 16. Additionally, the polysilicon of conductive recombination layer 22 may be doped with a slow moving element which produces a highly active recombination center. An ideal dopant of this type is titanium although others may be used. It should be understood that conductive recombination layer 22 must be sufficiently conductive to avoid excessive voltage drop by the current passing through it.

FIG. 3 shows conductive recombination layer 22 formed in a different manner than above. Following making first surface 18 and second surface 20 of second semiconductor substrate 16 parallel, a first doped polysilicon layer, 24, is formed on first surface 18 of second semiconductor substrate 16. Next, a tungsten silicide layer, 26, is formed on first doped polysilicon layer 24. This is followed by a second doped polysilicon layer, 28, being formed on tungsten silicide layer 26. Although layers 24 and 28 are comprised of polysilicon in this example, other polycrystalline materials well known by those in the art may also be used. In another embodiment of the present invention, conductive, recombination layer 22 may be comprised solely of tungsten silicide. It should be understood by those skilled in the art that conductive recombination layer 22 does not have to be formed on first surface 18 of second semiconductor substrate 16 and may be formed by other methods as long as it is disposed between first surfaces 12 and 18 of semiconductor substrates 10 and 16.

Once conductive recombination layer 22 has been formed, it is polished as is first surface 12 of first semiconductor substrate 10. This is so that a strong and uniform bond will be formed between them. After the polishing has occurred, first surface 12 of first semiconductor substrate 10 is bonded to conductive recombination layer 22. Typically, the bonding occurs at a high temperature in an oxidizing atmosphere. It should be understood that exact alignment of substrates 10 and 16 is not required in the present invention.

Each of the materials used to make the various conductive recombination layers 22 which were described above, that is, the individual layers comprising conductive recombination layer 22 are firmly bonded together. Once first semiconductor substrate 10 has been bonded to second semiconductor substrate 16 with conductive recombination layer 22 disposed therebetween, the remainder of the semiconductor device may be formed using standard techniques well known in the art. First semiconductor substrate 10 may be thinned after being bonded to second semiconductor substrate 16 in a uniform manner by lapping and polishing second surface 14, using second surface 20 as a reference, since surfaces 12, 14, 18 and 20 are all parallel after bonding.

FIG. 4 shows a base, 30, which has been formed in first semiconductor substrate 10. Additionally, an emitter, 32, has been formed in base 30. The remainder of first semiconductor substrate 10 as well as second semiconductor substrate 16 and conductive recombination layer 22 serve as the collector, 34, for the bipolar semiconductor device.

FIGS. 5-6 show highly enlarged cross-sectional views of sections of the preferred embodiment of an integrated circuit having a conductive recombination layer during various stages of processing. Initially, a first semiconductor substrate, 40, and a second semiconductor substrate, 42, are provided. In this embodiment, first semiconductor substrate 40 has an N conductivity type while second semiconductor substrate 42 has an N+ conductivity type. Both semiconductor substrates are comprised of silicon. It should be understood, however, that other semiconductor materials and conductivity types may be employed.

The first surface, 44, and second surface, 46, of first semiconductor substrate 40 are parallel to each other as are the first surface, 48, and second surface 50, of second semiconductor substrate 42. Again, this allows size requirements to be met following lapping and/or polishing of the substrates while the surfaces remain parallel. Following making surfaces 48 and 50 of second semiconductor substrate 42 parallel to each other, first surface 48 is polished and a phosphorous dopant is diffused into it giving an N++ layer, 49. This gives second semiconductor substrate 42 a highly doped N++ conductivity type at its first surface 48.

A plurality of trenches, 52, are etched into first semiconductor substrate 40 at its second surface 46. Standard etching methods are used to do this. Following the etching, first semiconductor substrate 40 is oxidized thereby forming an oxide layer, 54. Next, oxide layer 54 is removed in the power device area, 56, of first semiconductor substrate 40. This establishes a means for contact to power device area 56. A polysilicon layer 58, is then formed, here by deposition, on second surface 46 of first semiconductor substrate 40. The trenches 52 are overfilled by polysilicon layer 58 which is then polished to leave a coating of polysilicon layer 58 on the entire second surface 46 of first semiconductor substrate 40.

Before polishing polysilicon layer 58, a phosphorous dopant is diffused into polysilicon layer 58, converting it to N++, and forming and N++ layer, 59, on area 56. Now, the polished polysilicon layer 58 on second surface 46 of first semiconductor substrate 40 is bonded to polished first surface 48 of second semiconductor substrate 42. This bonding also occurs at a high temperature and in an oxidizing atmosphere. This bonding forms a conductive recombination layer, 60, comprising layers 49, 58, and 59. These layers may be utilized as part of the device to be fabricated in an area, 61. The device may be similar to that shown in FIG. 4.

Once the bonding has occurred, first surface 44 of first semiconductor substrate is polished or ground so that the plurality of trenches are exposed. The thicknesses of all regions such as 61, 62, 63, and 64 will be the same because surfaces 44, 46, 48 and 50 were all parallel prior to grinding or polishing. This completes the isolation for regions of the integrated circuit which require isolation. The remainder of the integrated circuit may be formed by using standard techniques which are well known in the art. It should be understood that this is extremely useful for an integrated circuit having a bipolar power device but may also be an effective way of processing to be used in other types of integrated circuits which incorporate MOS devices.

Thus it is apparent that there has been provided, in accordance with the invention, an improved bipolar semiconductor device having a conductive recombination layer and methods for fabricating it which meet the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of the invention.

We claim:

1. A semiconductor device having a conductive recombination layer comprising:
   a collector, said collector comprising:
      a first doped semiconductor substrate including a first surface and a second surface;
      a second doped semiconductor substrate having a greater dopant concentration than said first semiconductor substrate and including a first surface and a second surface; and
      a conductive recombination layer comprised of a doped polycrystalline material and disposed between said first and second substrates and further being contiguous to said first and second substrates at their first surfaces.

2. The device of claim 1 wherein the recombination layer is comprised of polysilicon.

3. The device of claim 1 wherein the recombination layer dopant comprises a slow-moving element which produces a highly active recombination layer.

4. The device of claim 3 wherein he recombination layer dopant comprises titanium.

5. The device of claim 1 wherein the recombination layer comprises:
   a first doped polycrystalline layer;
   a second doped polycrystalline layer; and
   a tungsten silicide layer disposed between said first and second doped polycrystalline layers.

6. The device of claim 5 wherein the first and second polycrystalline layers are comprised of polysilicon.

7. A bipolar semiconductor device having a conductive recombination layer comprising:
   a first doped semiconductor substrate including a first surface and a second surface;
   a second doped semiconductor substrate having a greater dopant concentration than said first semiconductor substrate and including a first surface and a second surface;
   a conductive recombination layer comprised of doped polycrystalline material disposed between said first and second substrates and further being contiguous to said first and second substrates at their first surfaces;
   a base being disposed in said second surface of said first semiconductor substrate; and
   an emitter being disposed in said base.

8. The device of claim 7 wherein the conductive recombination layer is comprised of polysilicon.

9. The device of claim 8 wherein the conductive recombination layer comprises:
   a first doped polysilicon layer;
   a second doped polysilicon layer; and
   a tungsten silicide layer disposed between said first and second doped polysilicon layers.

10. A semiconductor device having a conductive recombination layer comprising:
    a collector, said collector comprising:
       a first doped semiconductor substrate including a first surface and a second surface;
       a second doped semiconductor substrate having a greater dopant concentration than said first semiconductor substrate and including a first surface and a second surface wherein the dopant concentration is greater at said first surface than at said second surface; and
       a conductive recombination layer disposed between said first and second substrates and further being contiguous to said first and second substrates at their first surfaces.

11. A bipolar semiconductor device having a conductive recombination layer comprising:
    a first doped semiconductor substrate including a first surface and a second surface;
    a second doped semiconductor substrate having a greater dopant concentration than said first semiconductor substrate and including a first surface and a second surface wherein the dopant concentration is greater at said first surface than at said second surface;
    a conductive recombination layer disposed between said first and second substrates and further being contiguous to said first and second substrates at their first surfaces;
    a base being disposed in said second surface of said first semiconductor substrate; and
    an emitter being disposed in said base.

12. A bipolar semiconductor device being a conductive recombination layer comprising:
    a first doped semiconductor substrate including a first surface and a second surface;
    a second doped semiconductor substrate having a greater dopant concentration than said first semiconductor substrate and including a first surface and a second surface;
    a conductive recombination layer comprised of tungsten silicide and being disposed between said first and second substrates and further being contiguous to said first and second substrates at their first surfaces;
    a base being disposed in said second surface of said first semiconductor substrate; and
    an emitter being disposed in said base.

13. A semiconductor device having a conductive recombination layer comprising:
    a collector, said collector comprising:
       a first doped semiconductor substrate including a first surface and a second surface;
       a second doped semiconductor substrate having a greater dopant concentration than said first semiconductor substrate and including a first surface and a second surface; and
       a conductive recombination layer comprised of tungsten silicide and being disposed between said first and second substrates and further being contiguous to said first and second substrates at their first surfaces.

* * * * *